United States Patent
Mishra et al.

(10) Patent No.: US 7,042,383 B2
(45) Date of Patent: May 9, 2006

(54) HIGH SPEED GAIN AMPLIFIER AND METHOD IN ADCS

(75) Inventors: Vineet Mishra, Bangalore (IN); Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/904,322

(22) Filed: Nov. 4, 2004

(65) Prior Publication Data

US 2005/0110669 A1  May 26, 2005

Related U.S. Application Data

(60) Provisional application No. 60/525,283, filed on Nov. 26, 2003.

(51) Int. Cl.
*H03M 1/14* (2006.01)
*H03M 1/42* (2006.01)

(52) U.S. Cl. .................. 341/156; 341/161; 327/377; 327/91

(58) Field of Classification Search ........... 341/156, 341/161, 162, 163; 327/91, 94
See application file for complete search history.

(56) References Cited

U.S. PATENT DOCUMENTS 6,166,675 A * 12/2000 Bright .................. 341/162
6,400,301 B1   6/2002 kulhalli et al.
6,466,153 B1 * 10/2002 Yu ..................... 341/161

\* cited by examiner

*Primary Examiner*—Howard L. Williams
(74) *Attorney, Agent, or Firm*—W. Daniel Swayze, Jr.; W. James Brady; Frederick J. Telecky, Jr.

(57) ABSTRACT

An ADC implemented according to an aspect of the present invention contains a non-zero bit stage followed by a zero-bit stage. The non-zero bit stage generates a sub-code, which is used in generating a digital code corresponding to an input analog signal, and the zero-bit stage does not provide any such sub-codes. Such a feature may be attained by using a gain amplifier provided according to another aspect of the present invention. The gain amplifier contains a main-amplifier which operates as a zero bit stage, and is also used by the non-zero bit stage. The same capacitance value may be maintained between the input terminal and output terminal of the main-amplifier to implement the zero bit stage, which enables the main-amplifier to be implemented with a low gain.

27 Claims, 16 Drawing Sheets

HIGH SPEED GAIN AMPLIFIER AND METHOD IN ADCS

RELATED APPLICATION(S)

The present application is related to and claims priority from co-pending U.S. provisional patent application entitled, "High Speed Inter-Stage Gain Amplifier and Method in Pipeline ADC", Filed on: Nov. 26, 2003, Ser. No. 60/525,283, naming as inventors: MISHRA et al, and is incorporated in its entirety herewith into the present application.

BACKGROUND OF THE INVENTION

1. Field of the Invention

The present invention relates to gain amplifiers, and more specifically to improve speed of an amplifier used in analog to digital converters (ADCs).

2. Related Art

Gain amplifiers are often employed to amplify signals. In general, a gain amplifier amplifies an input signal to generate an amplified output signal. For example, gain amplifiers are employed in, but not limited to, Programmable Gain Amplifiers (PGAs), Analog to Digital Converters (ADCs).

An example gain amplifier used in pipeline ADCs is described in U.S. Pat. No. 6,400,301 entitled "Amplifying Signals in Switched Capacitor Environments", issued Jun. 4, 2002 to Kulhalli et al (hereafter '301 patent'), and is incorporated in its entirety into the present application. Only the details of the 301 patent as believed to be relevant to an understanding of the background are provided in this section. For further details, the reader is referred to the 301 patent available from the U.S. Patent Office, www.uspto.gov.

An ADC in the 301 patent is described as containing sample and hold amplifier (SHA) 110, and stages 120-1 through 120-S as depicted in FIG. 1A. SHA 110 samples input signal received on path 134 and holds the voltage level of the sample for further processing. Stages 120-1 through 120-S together convert the voltage level of the sampled input signal received on path 111 into a corresponding N-bit digital code.

Each stage contains active components to have the ability to drive a next stage. In addition, each stage may resolve some of the bits of the digital value sought to be generated. Thus, each stage 120-1 through 120-S generates a P-bit sub-code corresponding to a voltage level of an analog signal received as an input. For example, stage 120-1 converts a voltage level on path 111 to generate a P-bit sub-code on path 121. The output of each stage is provided as an input to next stage, and thus the previous stage drives the next stage. Stage 120-1 drives stage 120-2 since the output of stage 120-1 is provided on path 111 as input to stage 120-2.

Each stage, except last stage 120-S, generates an output signal which represents ((Vi−Vdac)×Gain), wherein Vi represents the voltage level received from previous stage, Vdac equals ((sub-code×Vref)/2P), with P representing the number of bits in the generated sub-code, gain equals 2P, 'x' representing a multiplication operation and '/' representing the division operation.

Digital error correction block 130 receives P-bit sub-code from each stage and corrects error in each P-bit sub-code to provide on path 146 the digital code corresponding to the sample received on path 134. The 301 patent discloses the details of the stages, and is summarized below with reference to FIG. 1B.

Stage 120-1 of FIG. 1B is shown containing flash ADC 150, digital to analog converter (DAC) 160, subtractor 170, and gain amplifier 180. Flash ADC 150 converts a sample of an analog signal received on path 111 into a corresponding P-bit sub-code provided on path 156 (contained in path 121 of FIG. 1A, and P is less than N). DAC 160 converts the sub-code received on path 156 into corresponding analog signal (Vdac) on path 167.

Subtractor 170 generates the difference of sample 111 (Vi) and the analog signal received on path 167 (Vdac). Gain amplifier 180 amplifies the difference voltage (Vi−Vdac) with a gain of 2P and is provided on path 112. The signal on path 112 is used to resolve the remaining bits in the N-bit digital code by the next ADC stages.

The details of an example implementation of flash ADC 150 is shown in FIG. 1C, which is shown containing resistors 195-1 through 195-Q and comparators 140-1 through 140-(Q-1), wherein Q equals 2P.

Resistor ladder containing resistors 195-1 through 195-Q of equal resistance values, divides the reference voltage Vref received on path 191 into the Q-1 voltage levels. Each comparator 140-1 through 140-(Q-1) compares the corresponding division of Vref 191 with the voltage level of the input signal received on path 111, and generates the corresponding logical value.

The outputs of the comparators can be used to generate a P-bit sub-code using a decoder (not shown). Alternatively, the results of the comparisons can be provided directly to subtractor 170, and the combination of subtractor 170 and gain amplifier 180 can be implemented using a switched capacitor circuit as described below with reference to FIGS. 2A–2C.

Circuit 190 of FIG. 2A is shown containing pre-amplifier (pre-amp) 210, main-amplifier (main-amp) 220, capacitors 230-1 through 230-6, and switches 240-1 through 240-6 and 250-1 through 250-5. Switches 240-1 through 240-6 are turned on during one phase of a clock signal (S-phase) and switches 250-1 through 250-3 are turned on during another phase of a clock signal (H-phase). Path 205 provides the Vdac (path 167) of one stage via switch 250-1, and path 204 provides the Vdac of the next stage via switch 240-3.

FIG. 2B depicts the status of configuration of circuit 190 during sampling phase (S-phase). During S-phase, pre-amp 210 and main-amp 220 are decoupled (due to open switch 250-2), and main-amp 220 operates as a part of the gain amplifier of the next stage. Capacitor 230-1 samples input signal on path 111 through switch 240-1 and main-amp 220 provides the required input signal to be sampled by capacitor 230-5 of the next stage. Capacitor 230-4 receives DAC input of the next stage on path 240 through switch 240-3 and the charge on capacitor 230-4, which represents a residue voltage (input voltage to be received from next stage–DAC input on path 204) is transferred to capacitor 230-6. Thus the output of main-amp 220 represents the amplified residue voltage to the next stage.

FIG. 2C depicts the configuration of circuit 190 during hold phase (H-phase). During H-phase, pre-amp 210 and main-amp 220 are connected through switch 250-2, and both together amplify the sampled signal in S-phase. However, capacitor 230-1 receives DAC input on path 205 through switch 250-1 and thus the difference of Vdac from the voltage of sampled signal is amplified. The amplified signal is provided as an amplified residue voltage to the next stage. In addition, switch 250-5 is closed and thus the effective capacitance between the input terminal and output terminal of main-amplifier 220 changes compared to the effective capacitance in the sampling phase.

It may be noted that, stage 120-1 resolves bits in both S-phase and H-phase by receiving the corresponding DAC inputs on paths 204 and 205. Due to such resolution, gain amplifier 180 needs to have a high gain since charge redistribution occurs while resolving the bits. Charge redistribution generally requires high gain at least to meet the linearity requirements of the stages in pipeline ADC 100 as is well known in the relevant arts. Charge redistribution occurs in H-phase due to the transfer of charge on sampling capacitor 230-1 to feed back capacitor 230-3.

Similarly, charge redistribution occurs in S-phase also since one end of compensation capacitor 230-4 is connected to receive DAC input 204 and the charge on capacitor 230-4 is transferred on to capacitor 230-6. During H-phase, both pre-amp 210 and main-amp 220 together resolve bits, however, during S-phase, main-amp 220 resolves the bits of the next stage. Thus, main-amp 220 needs to have a high gain.

One problem with such a main-amplifier is that throughput performance/speed (bandwidth) may be reduced due to the high gain requirement.

Another problem with such a main-amplifier is that the output signal of a high gain amplifier may not settle quickly. Faster settling of signals may be required since the output of each stage is used in the next stage. For example, in one embodiment, the S (shown as 270) and H (shown as 280) signals may be generated as in FIG. 2D, and comparators 140-1 through 140-(Q-1) may need to make bit decisions (i.e., generate corresponding outputs) within duration 261 (i.e., before the rising edge of the next S-phase of the clock signal). Performing such a quick conversion enables main-amplifier 220 to resolve the bits of the next stage in the S-phase itself (thereby not requiring additional stages and thus reducing the power consumption).

Accordingly, it may be appreciated that flash ADC 150 may have a limited time (only between the edges of the sample phase and hold phase of the clock signal) to make a bit decision and thus the output of gain amplifier needs to settle to the correct value quickly. Unfortunately, implementation of high gain amplifiers with short settling times may pose challenges.

Furthermore, as the desired throughput performance of an ADC increases, the settling time may need to be further reduced, which may make the approach(es) of the 301 patent deficient for performing amplifications at high speeds (and thus unsuitable for high speed ADCs as well).

At least for reasons such as those described above, what is needed is a method and apparatus which enables implementation of a high speed gain amplifier.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

Figure 1A:
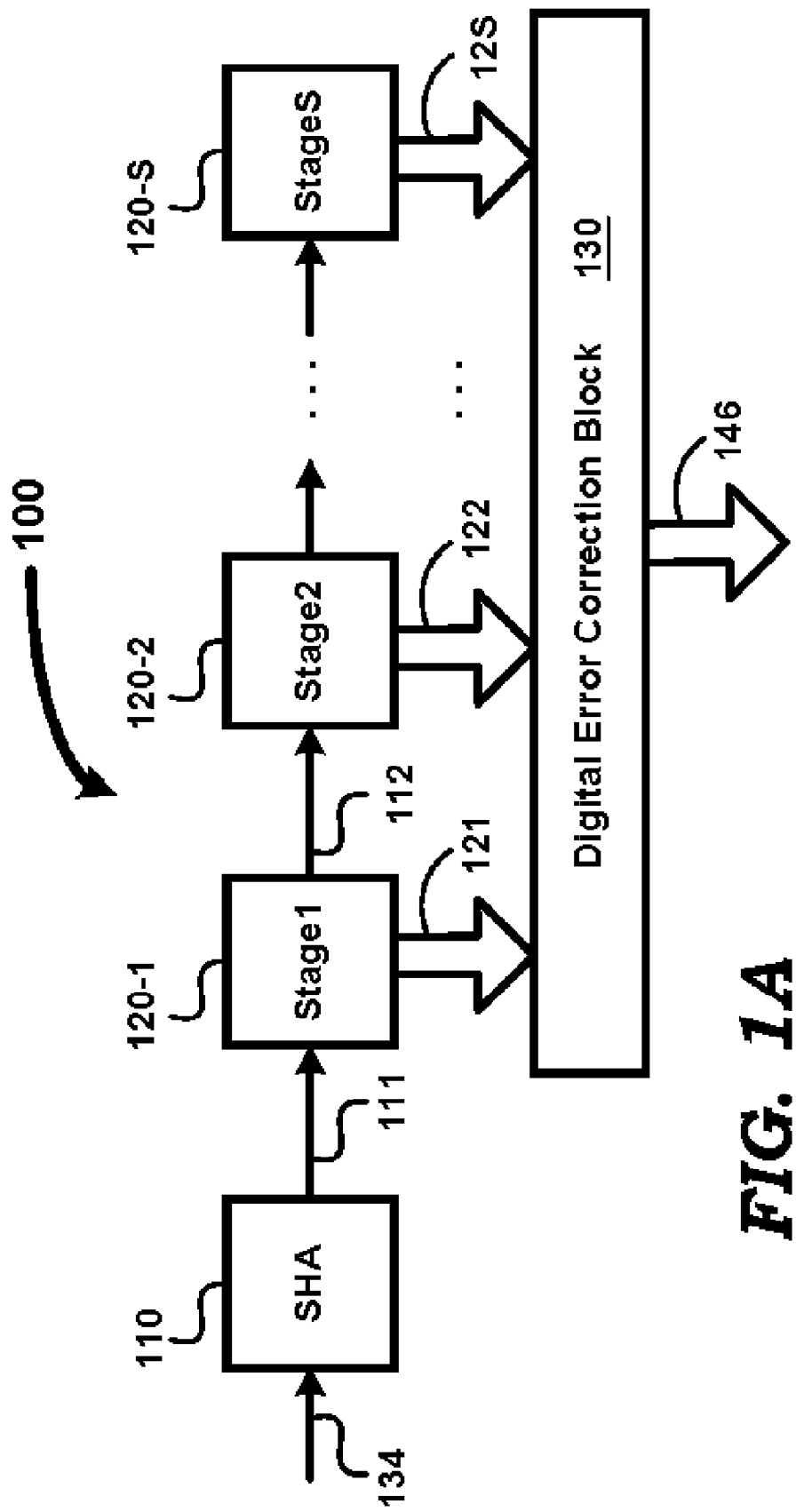
FIG. 1A is a block diagram illustrating the details of a prior pipeline ADC.

An aspect of the present invention improves the speed of a pipeline analog to digital converter (ADC) by containing a non-zero bit stage followed by a zero bit stage. A non-zero bit stage resolves bits and amplifies the residue voltage (input voltage less equivalent voltage of the resolved bits) to provide the amplified residue signal to next stage. A zero-bit stage does not resolve any bits and holds the received input to provide to a next non-zero bit stage.

As the zero bit stage does not resolve any bits and only needs to drive the next stage, the zero bit stage can be implemented with reduced complexity.

In one embodiment, the stages are implemented using a shared amplifier (main-amplifier is shared between the stages). In such an embodiment, the shared amplifier supports the zero bit stage. As the zero-bit stage does not resolve any bits, charge redistribution does not occur and thus the shared amplifier can be implemented with a low open loop gain. As amplifiers with low gain settle quickly, a zero-bit stage can be implemented with high throughput performance. Similarly, as the non-zero bit stage drives low capacitive load, the non-zero bit stage can also be implemented with high throughput performance. As a result, high speed ADCs may be implemented using several aspects of the present invention.

Another aspect of the present invention provides a gain amplifier, which enables the zero bit stage and non-zero bit stage to be implemented using shared components. The gain amplifier of the non-zero bit stage may contain a pre-amplifier and a main-amplifier. A switch may be provided between the two amplifiers. A closed state of the switch causes the combination of the two amplifiers to amplify an input signal received by the pre-amplifier together. An open state of the switch causes the main-amplifier to provide the amplified signal to be provided to a next stage.

The same effective capacitance may be maintained between the input terminal and output terminal of the main-amplifier during both the open and close states of the switch, which enables the main-amplifier to operate as a zero bit stage.

Since the main-amplifier does not receive the voltage equivalent of the resolved bits, the main-amplifier can be implemented with a low gain (at least in comparison with the 301 patent noted above). In other words, charge redistribution may be performed by both pre-amplifier and the main-amplifier, and hence the main-amplifier can be implemented with a low gain. The desired gain of the gain amplifier may be split between the pre-amplifier and the main-amplifier, which facilitates the use of simple structures for the two amplifiers. In an embodiment, such a simple structure can be realized using telescopic cascode structures, which can be implemented with NMOS transistors, thereby further enhancing the speed of the gain amplifier.

In an embodiment, the approach(es) noted above may provide more time for comparators present in flash ADCs (an example of sub-ADCs) to make bit decisions. Since the main-amplifier does not resolve any bits in the S-phase, comparators may be provided substantially more time as described in sections below with examples. As a result, stringent requirements on the design of comparators may be reduced, and thus power consumption and area requirements may also be reduced.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Pipeline ADC

Figure 3:
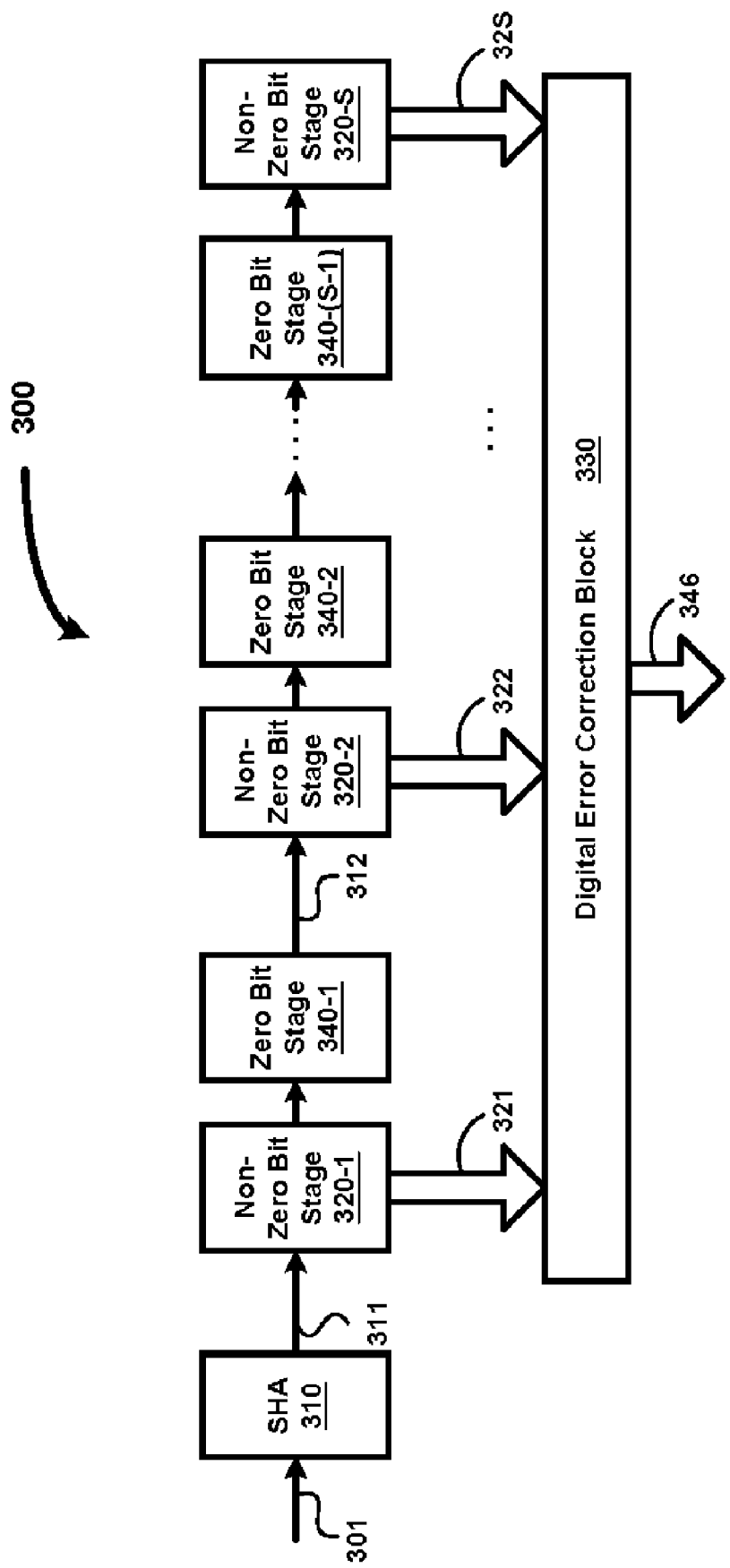
FIG. 3 is a block diagram illustrating the details of a pipeline ADC in an embodiment of the present invention.

FIG. 3 is a block diagram illustrating the details of a pipeline ADC in an embodiment of the present invention. Pipeline ADC 300 is shown is shown containing sample and hold amplifier (SHA) 310, non-zero bit stages 320-1 through 320-S and zero bit stages 340-1 through 340-(S-1). Each block is described below.

SHA 310 samples input signal received on path 301 and holds the voltage level of the sample for further processing. The voltage level of the sampled input signal is provided on path 311 for conversion into a corresponding digital code.

Digital error correction block 330 (example of an error correction circuit) receives P-bit sub-codes from each non-zero bit stage 320-1 through 320-S, and corrects any errors in the sub-codes. Digital error correction block 330 provides on path 346 the digital code corresponding to the sample received on path 301 based on the P-bit sub-codes generated by stages 320-1 through 320-S.

Each zero-bit stage 340-1 and 340-2 holds the output signal received from a corresponding prior non-zero bit stage 320-1 and 320-2, and provides the signal to next stage (e.g., 320-2 on path 312). Zero bit stages 340-1 and 340-2 are respectively shown connected following the non-zero bit stages 320-1 through 320-2. In an embodiment, zero bit stages are employed only associated with the first two non-zero bit stages, since the accuracy requirement is more important in the early stages.

Each non-zero bit stage generates a P-bit sub-code from the corresponding input signal. For example, non-zero bit stage 320-1 converts a voltage level on path 311 to generate a P-bit sub-code on path 321. Each non-zero bit stage 320-1 through 320-S except last stage generates an output signal, which represents $((Vi-Vdac) \times Gain)$, wherein Vi represents the voltage level of the input signal received from previous stage, Vdac represents an equivalent voltage corresponding to sub-code and equals $((sub\text{-}code \times Vref)/2P)$, with P representing the number of bits in the generated sub-code, gain equals 2P, and x representing a multiplication operation.

Figure 1B:
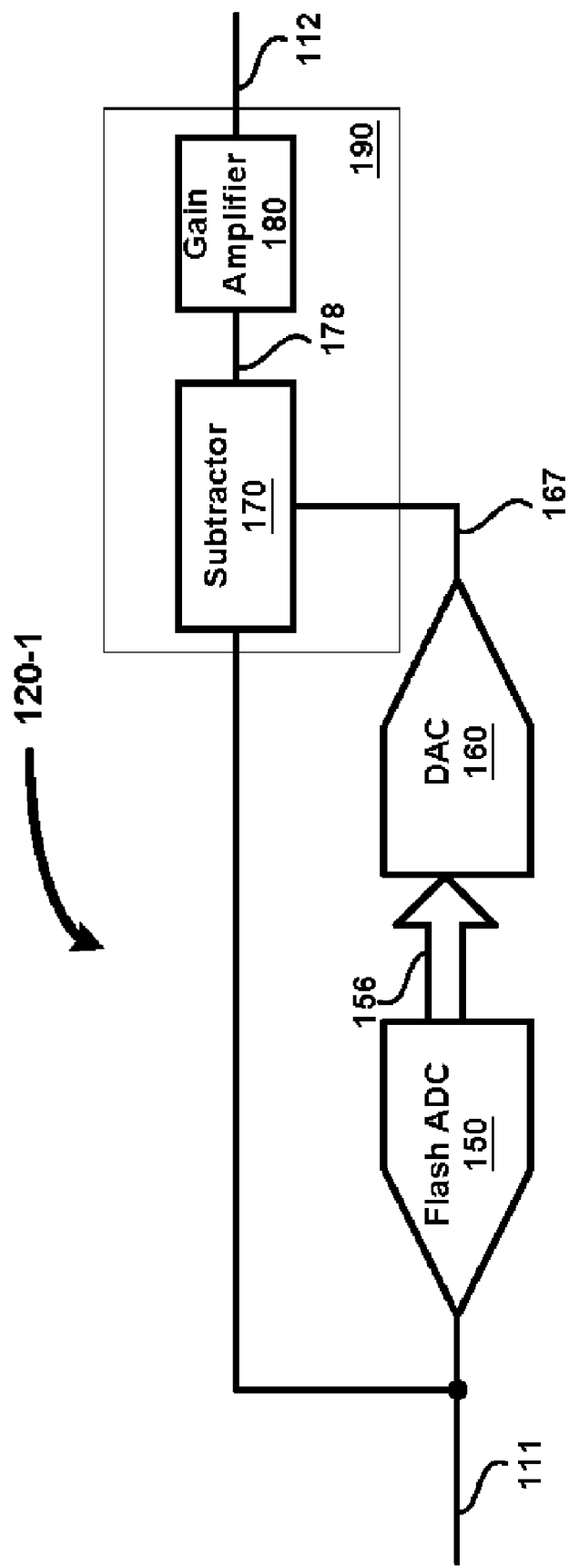
FIG. 1B is a block diagram illustrating the details of a stage in a prior pipeline ADC.
Figure 1C:
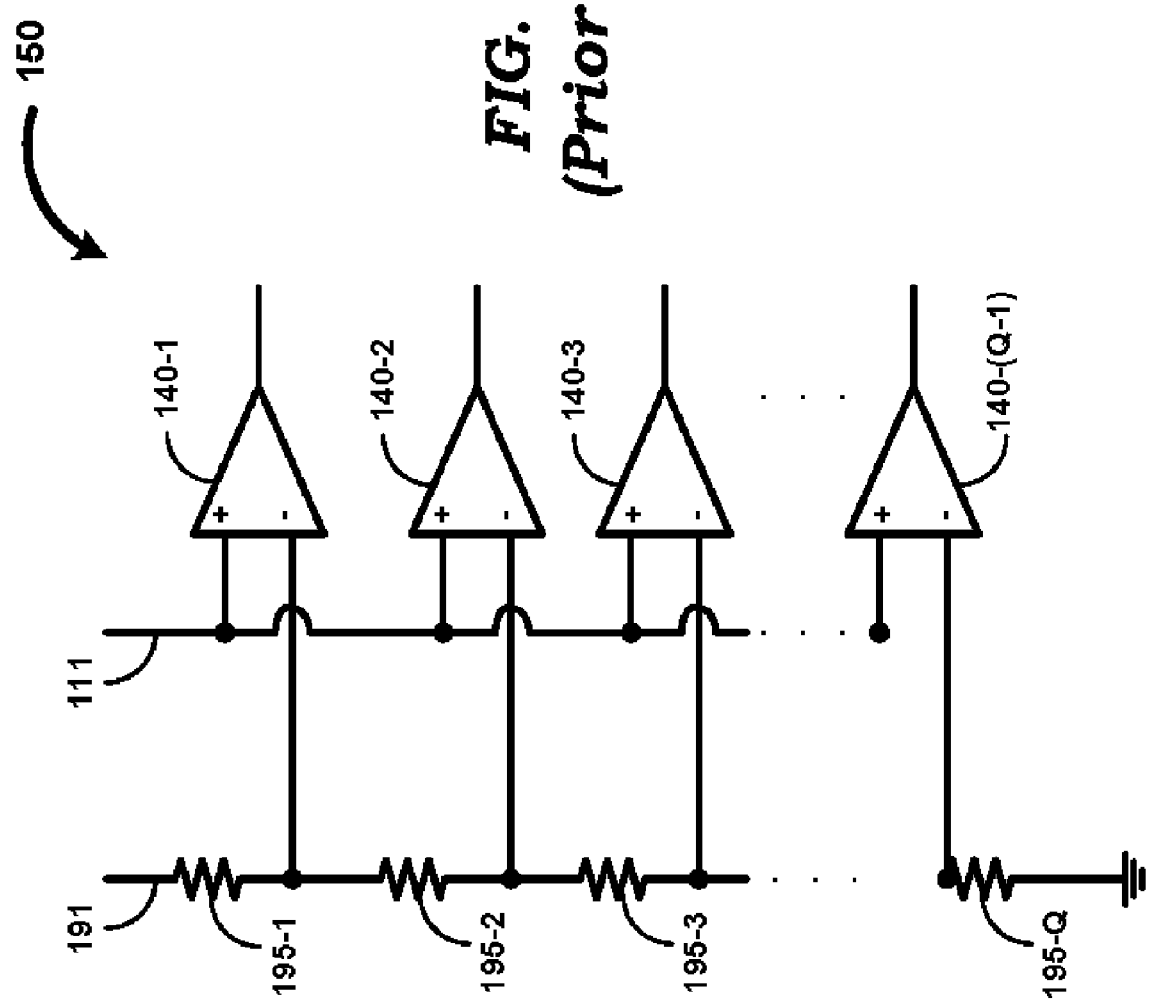
FIG. 1C is a block diagram illustrating the details of a flash ADC.
Figure 2A:
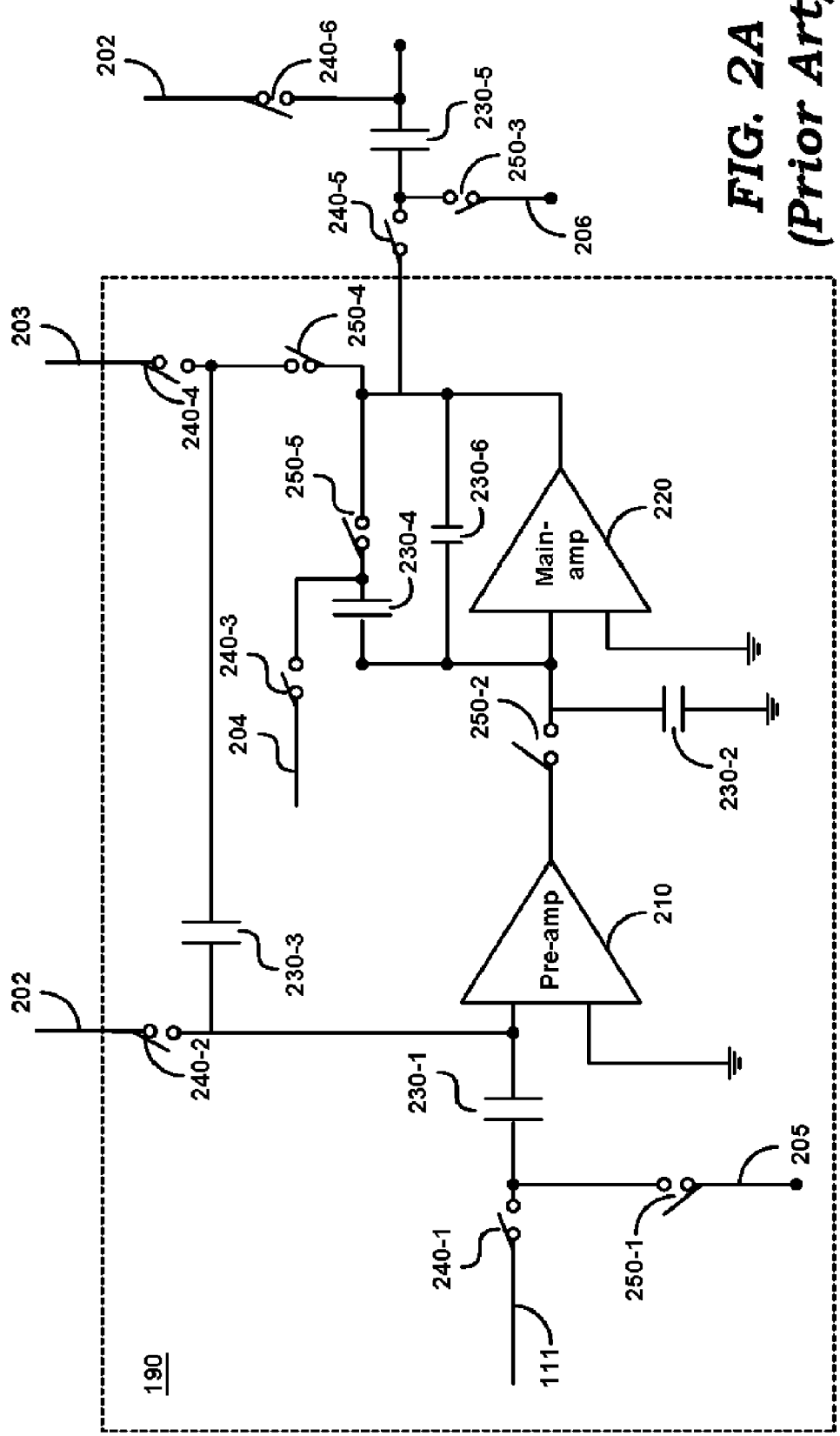
FIG. 2A is a circuit diagram illustrating the details of a prior gain amplifier.
Figure 2B:
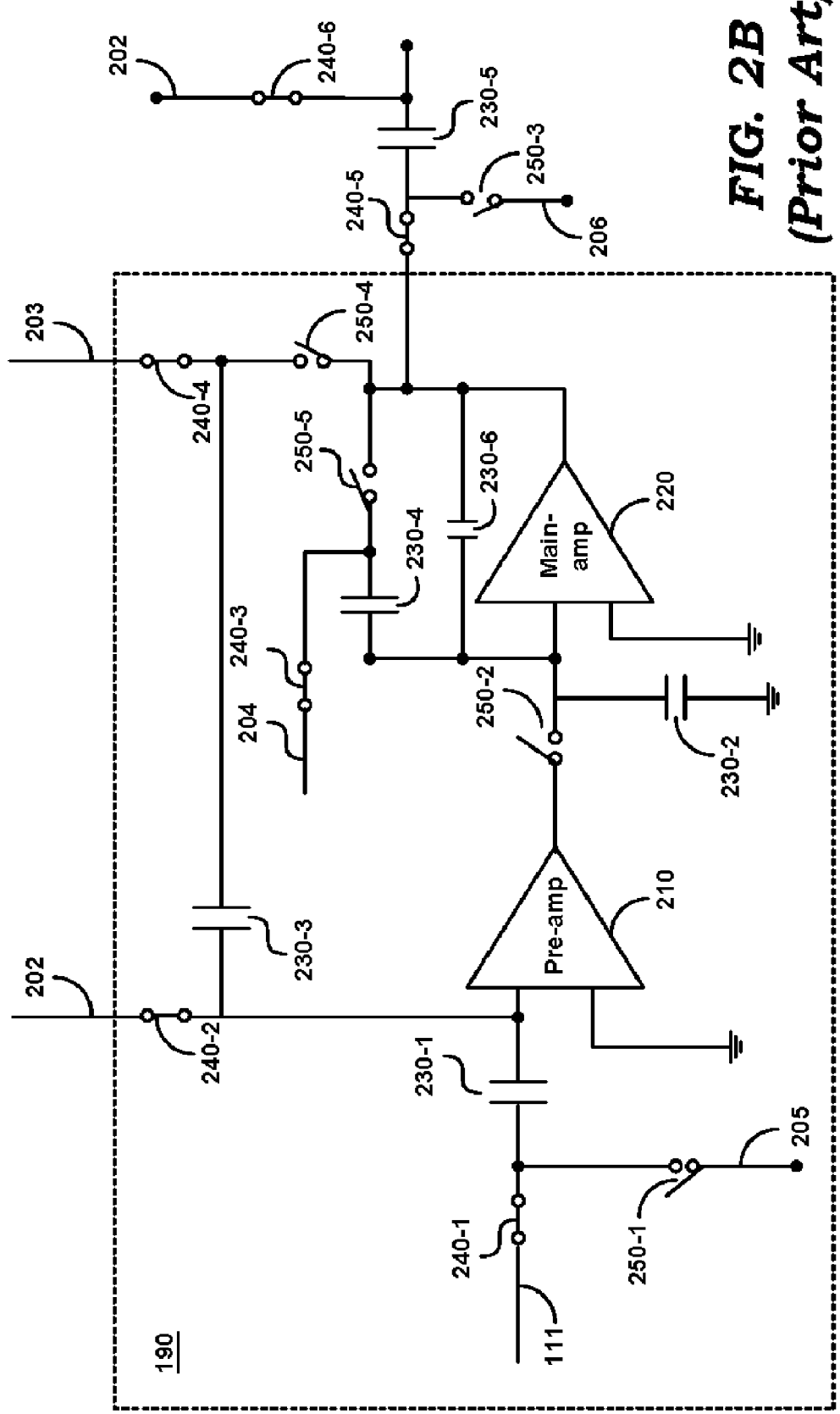
FIG. 2B is a circuit diagram illustrating the details of a prior gain amplifier in a sampling phase.
Figure 2C:
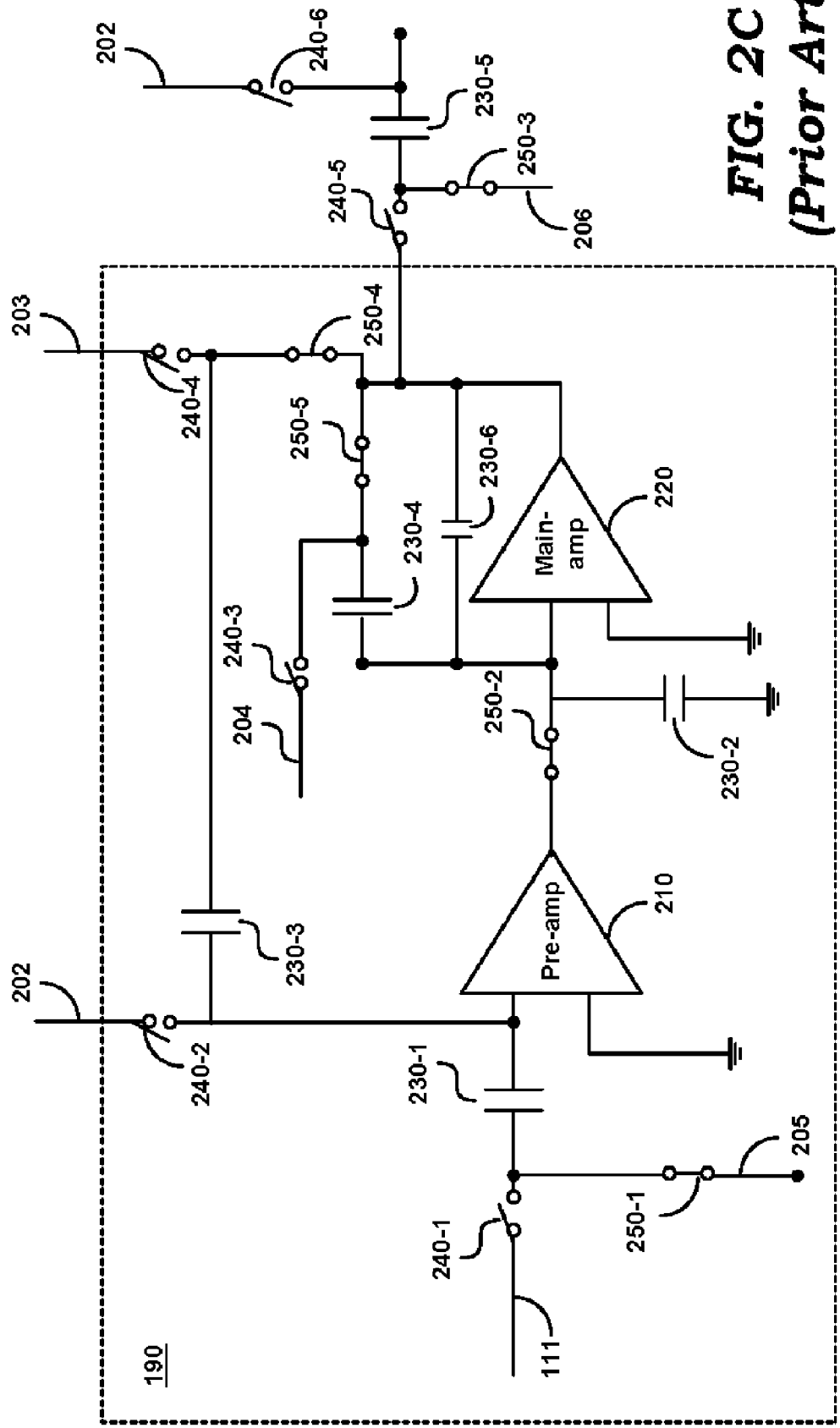
FIG. 2C is a circuit diagram illustrating the details of a prior gain amplifier in a hold phase.
Figure 2D:
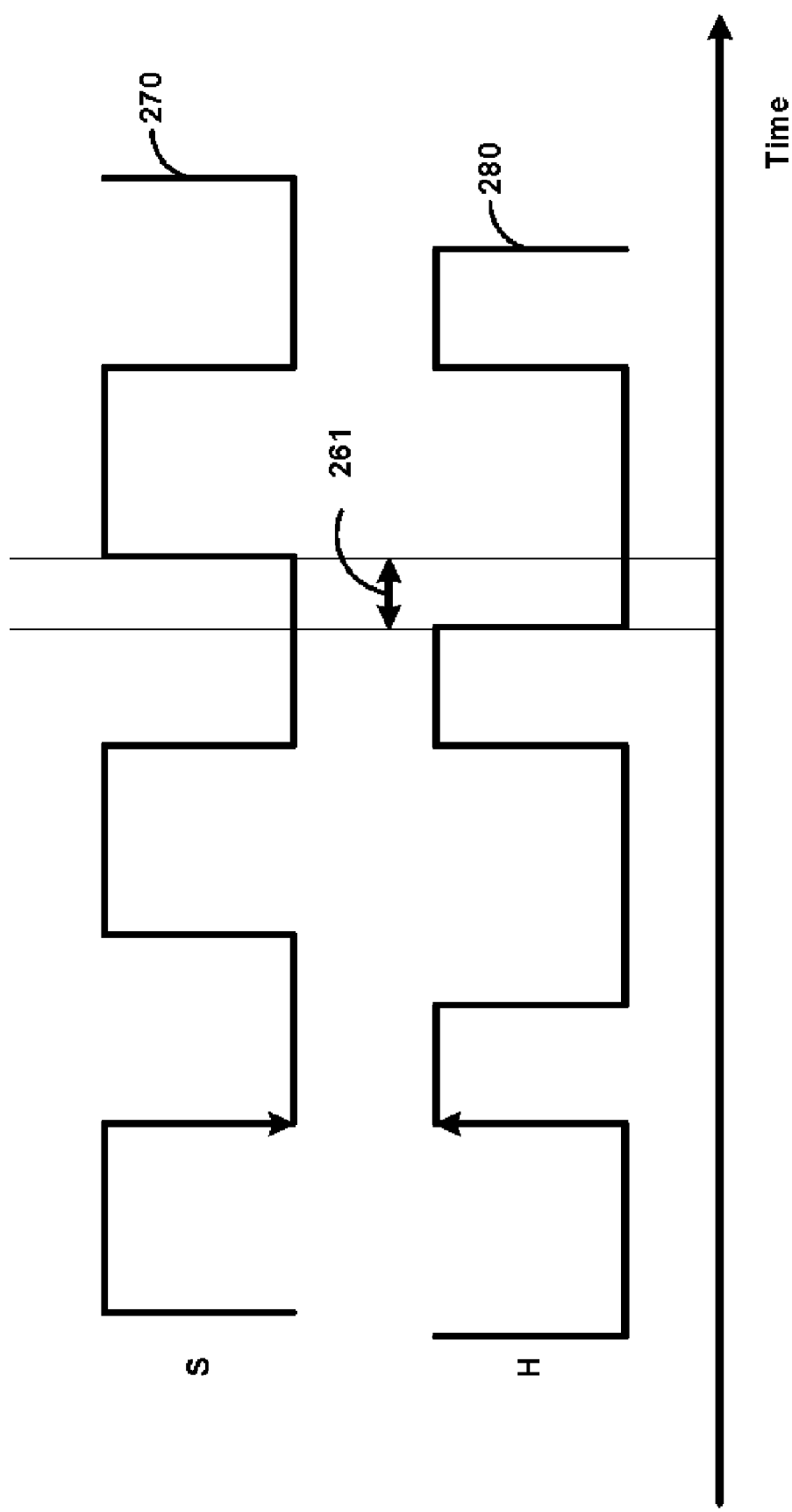
FIG. 2D is a timing diagram depicting S-phase and H-phase signals used in a prior pipeline ADC.

Each non-zero bit stage may contain a flash ADC, DAC, subtractor and gain amplifier, similar to the logical approach of FIG. 1B. An aspect of the present invention enables the gain amplifier to be implemented with higher throughput performance (compared to circuit 190 of FIG. 2A) as described below with reference to FIG. 4.

3. Gain Amplifier

Figure 4:
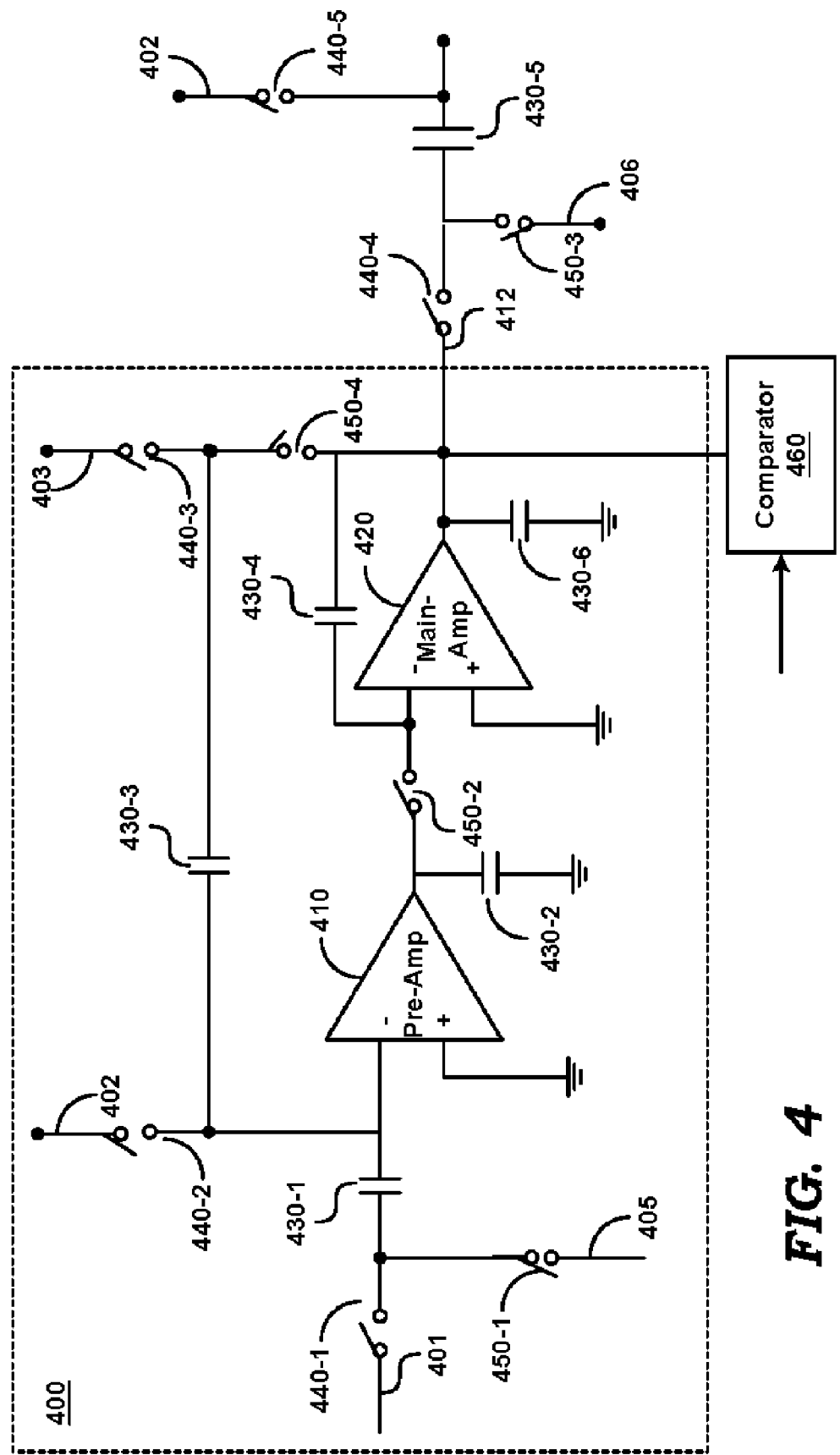
FIG. 4 is a circuit diagram illustrating the manner in which a gain amplifier may be implemented according to various aspects of the present invention.

FIG. 4 is a circuit diagram illustrating the manner in which circuit 400 containing gain amplifier 180 and subtractor 170 may be implemented according to various aspects of the present invention. For illustration, circuit 400 is described as implementing part of stages 320-1 and 340-1 of FIG. 3, however various features of the gain amplifier can be implemented in other environments as well.

Circuit 400 is shown containing pre-amplifier (pre-amp) 410, main-amplifier (main-amp) 420, capacitors 430-1 through 430-4 and 430-6, and switches 440-1 through 440-3, 450-1, 450-2, and 450-4. FIG. 4 is also shown containing capacitor 430-5 and switches 440-4, 440-5 and 450-3, which may be contained in the gain amplifier of next stage 320-2 of FIG. 3. Each component of FIG. 4 is described below.

Pre-amp 410, main-amp 420 and compensation capacitor 430-4 together operate as a Miller compensated amplifier, described in further detail in a document/book entitled, "Analog Integrated circuit design" by David John, Ken-Martin, Chapter-5, Pages 240 and 241. Sampling capacitor 430-1 samples input signal received on path 401. Capacitor 430-1 may be implemented as a stack of capacitors, connected in parallel. The capacitors are used to sample the input voltage received on path 401 and to perform the subtraction operation based on the outputs generated by the ADC (e.g., comparators 140-1 through 140-Q-1), and may be operated in a known way.

Capacitor 430-3 operates as a feed back capacitor connected between the output of main-amp 420 and input of pre-amp 410. Capacitance values of capacitors 430-1 and 430-3 determine the amplification factor of gain amplifier 400. Capacitor 430-4 connected between the input and output of main-amp 420 operates as a compensation capacitor. Capacitors 430-2 and 430-6 represent parasitic capacitance.

The voltage received on path 402 represents the common mode voltage for pre-amp 410 and the voltage received on path 403 represents the common mode voltage for main-amp 420. Voltages 402 and 403 may be used to set up operating conditions of pre-amp 410 and main-amp 420.

Switches 440-1 through 440-3 and 450-1 through 450-4 control the operation of circuit 400. The phase signals that control various switches are described below with reference to FIG. 5, and the operation of circuit 400 in the corresponding phases is described then with reference to FIGS. 6 and 7.

Figure 5:
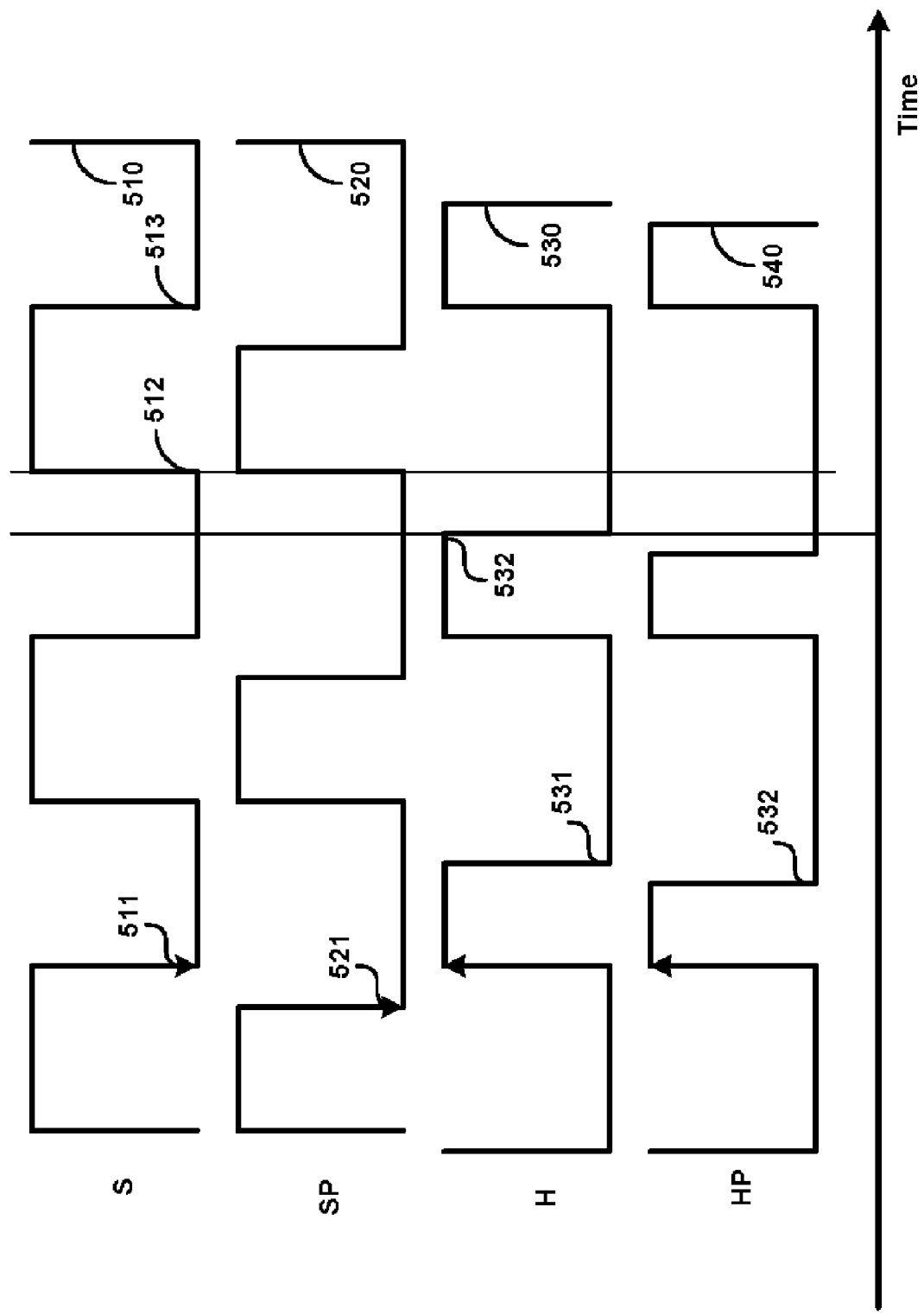
FIG. 5 is a timing diagram depicting various phase signals used in an embodiment of a pipeline ADC implemented according to various aspects of the present invention.

FIG. 5 is a timing diagram depicting the details of S, SP, H and HP phase signals. Waveforms 510, 520, 530 and 540 respectively represent S-phase, SP-phase, H-phase and HP-phase signals. S-phase signal 510 controls the operation of switches 440-1, 440-3 and 440-4, SP-phase signal 520 controls the operation of switches 440-2 and 440-5. H-phase signal 530 controls the operation of switches 450-1, 450-3 and 450-4, and HP-phase signal 540 controls the operation of switch 450-2.

It may be observed that S-phase signal 510 and SP-phase signal 520 change in a similar manner except that the falling edge (e.g., 521) of SP-phase signal 520 occurs before the falling edge (511) of S-phase signal 510. Such a change causes switches 440-2 and 440-4 to be turned off before switch 440-1 is turned off, thereby avoiding charge injection on capacitors 430-1 and 430-3.

Similarly, H-phase signal 530 and HP-phase signal 540 change in a similar manner except that the falling edge (e.g., 531) of HP-phase signal 530 occurs before the falling edge (541) of H-phase signal 540. Such a change causes switch 450-2 to be turned off, thereby avoiding charge injection on capacitors 430-1, 430-3 and 430-4.

It may be further observed that non-overlapping portion is presented between the falling edge of H-phase signal 530 (and HP-phase signal 540) and the rising edge of S-phase signal 510 (and SP-phase signal 520). Such non-overlapping period may enable comparator 400 to make bit decisions without consuming additional phases. Due to various aspects of the present invention, comparator 460 (may contain comparators 140-1 through 140-Q-1) may be provided with more time (i.e., duration between time points 532 and 512) to make bit decisions, as described in sections below. The operation of circuit 400 in hold phase is first described below.

4. Gain Amplifier in the Hold Phase

Figure 6:
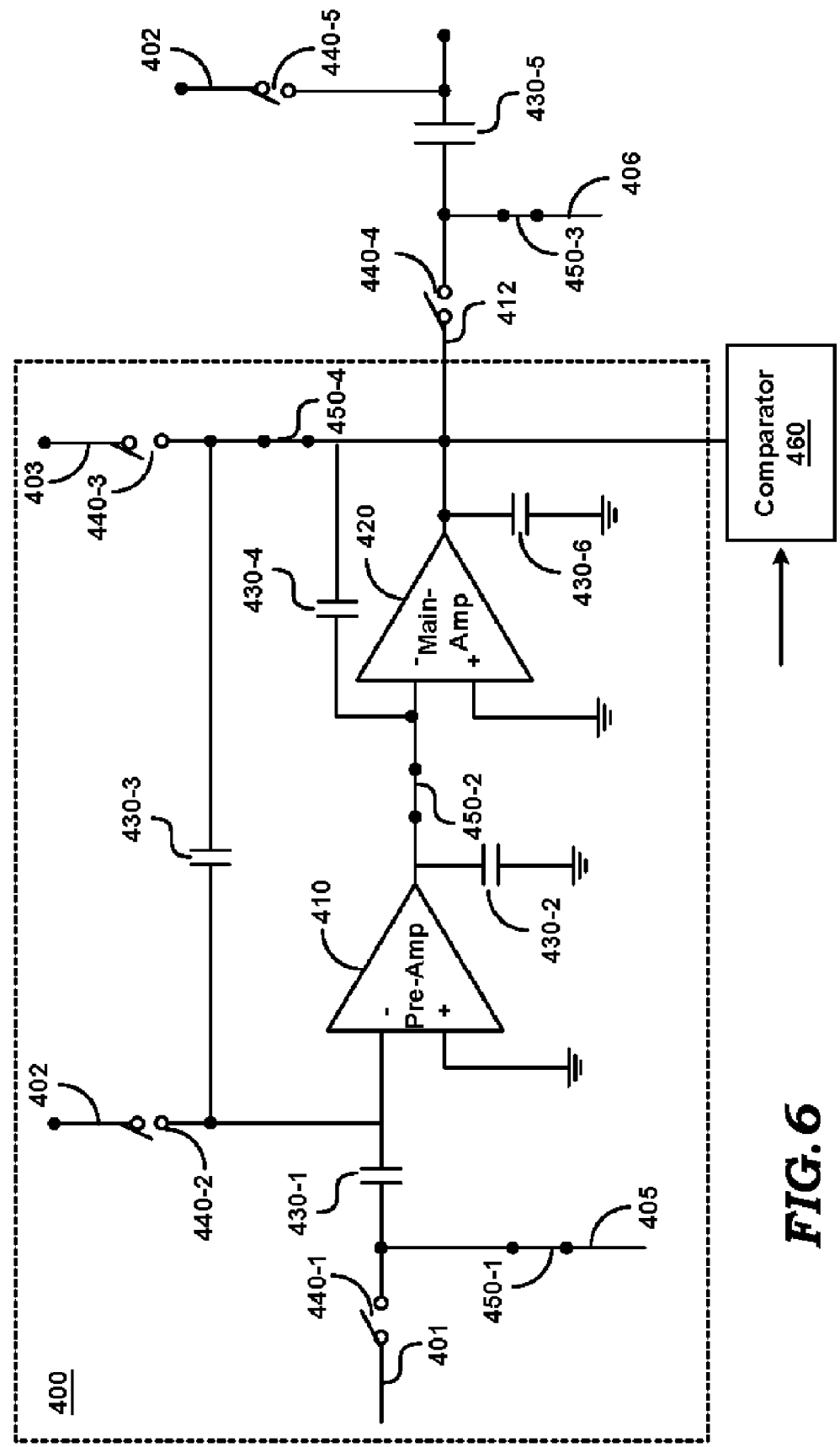
FIG. 6 is a circuit diagram illustrating the configuration of a gain amplifier during the hold phase in an embodiment of the present invention.

FIG. 6 is a circuit diagram illustrating the configuration of circuit 400 during hold phase in an embodiment of the present invention. It may be observed that switches 450-1 through 450-3, which are operated by H-phase and HP-phase signals, are shown closed during hold phase.

Switch 450-2 is closed in hold phase, and thus pre-amp 410 and main-amp 420 together amplify the charge on capacitor 430-1. Capacitor 430-1 contains the charge representing the input signal sampled in the immediately preceding sampling phase (as described below with reference to FIG. 7) and receives DAC input (an equivalent voltage corresponding to the resolved P-bit sub-code) on path 405. As a result, the charge on capacitor 430-1 represents the difference of input signal and voltage of DAC input (Vi–Vdac). The charge on capacitor 430-1 is transferred on to feed back capacitor 430-3 and compensation capacitor 430-4.

The capacitance values of capacitors 430-1 and 430-3 determine the amplification factor of gain amplifier 180 and the amplified signal is provided on path 412. Next stage 320-2 is disconnected from receiving signal 412 in hold phase, however the signal on path 412 is sampled by capacitor 430-5 in the next sampling phase. The operation of circuit 400 in sampling phase is described below with reference to FIG. 7.

5. Gain Amplifier in the Sampling Phase

Figure 7:
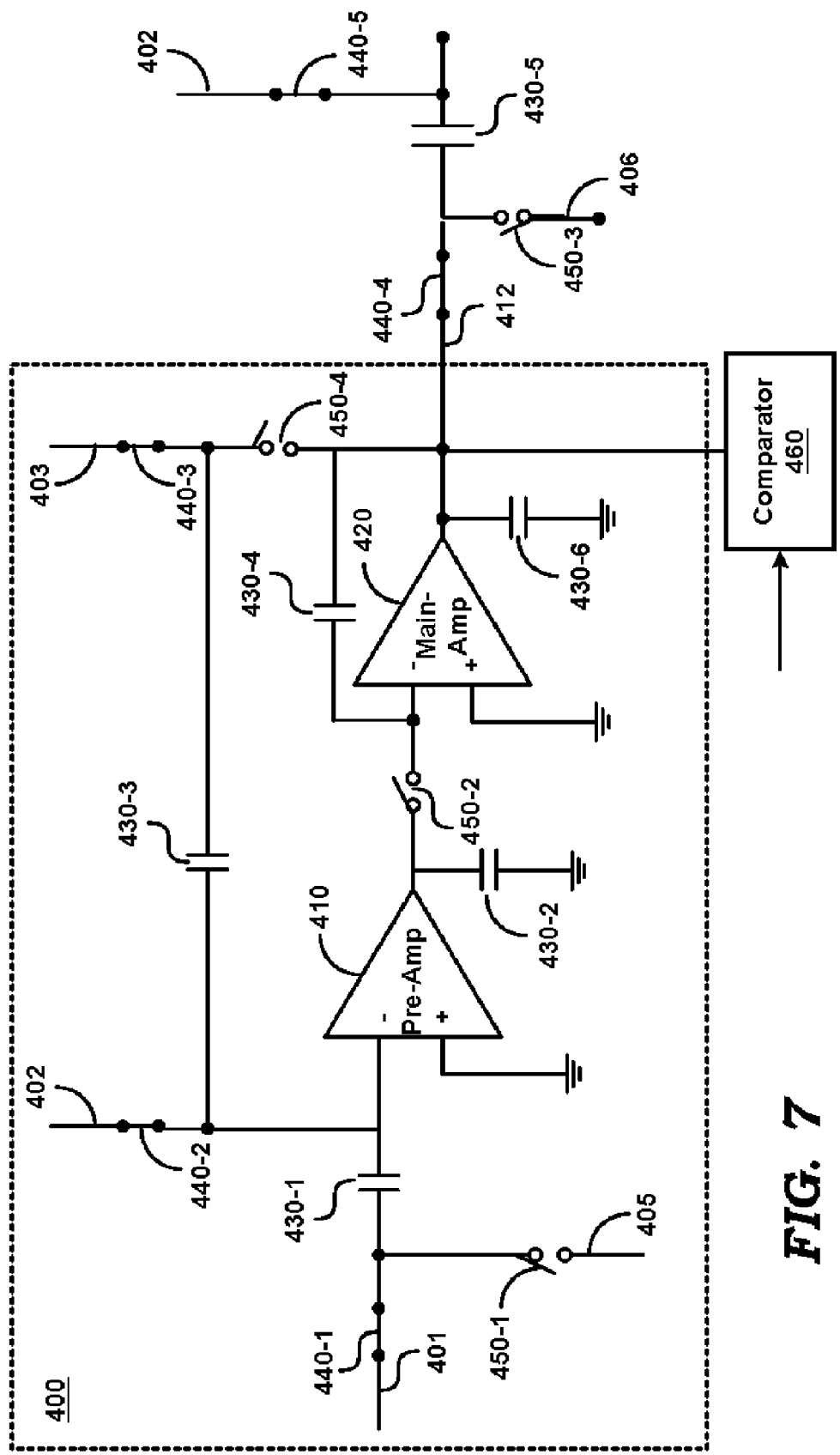
FIG. 7 is a circuit diagram illustrating the configuration of a gain amplifier during the sampling phase in an embodiment of the present invention.

FIG. 7 is a circuit diagram illustrating the configuration of circuit 400 during sampling phase in an embodiment of the present invention. It may be observed that switches 440-1 through 440-5, which are operated by S-phase and SP-phase signals, are shown closed during sampling phase.

Switch 450-2 is opened in sampling phase, and thus pre-amp 410 and main-amp 420 are decoupled. Due to the de-coupling (and closing of switch 440-1), capacitor 430-1 samples the input signal received on path 401, and main-amp 420 provides the signal on path 412 to be sampled by capacitor 430-5 present in the next non-zero bit stage 320-2. The signal on path 412 represents the amplified residue voltage to be resolved by the next stages in pipeline ADC 300.

Even though switch 450-2 is opened in sampling phase, the same effective capacitance (due to the connection of capacitor 430-4) may be maintained between the input terminal and output terminal of main-amplifier 420 during both the open and close states of switch 450-2, which enables main-amplifier 420 to operate as a zero bit stage. As main-amplifier 420 is in closed loop (due to the connection of capacitor 430-4), the charge at negative terminal of main-amplifier 420 is conserved to maintain the output voltage on path 412. In addition, the charge is not distributed across capacitors and thus main-amplifier 420 operates as a zero bit stage. It may be noted that since circuit 400 does not resolve any bits during sampling phase, main-amp 420 needs to drive only the next stage capacitive load and thus the gain requirement on main-amp 420 is minimal.

Therefore, the total gain of gain amplifier 180 can be distributed between pre-amp 410 and main-amp 420 as there is no gain requirement on main-amp 420 alone, and the gain of main-amp 420 remains the same in sampling phase and hold phase. In an embodiment, the gain of pre-amp 410 and main-amp 420 is chosen to be equal (that is 50 db each). In contrast, in an embodiment implemented according to the approaches described in 301 patent, the gain of main-amplifier needs to be higher than that of the pre-amplifier.

Due to the low gain requirements, main-amplifier and pre-amplifier can be implemented with simple amplifier structures, for example, telescopic cascode structures, which reduce the design complexity of amplifiers. Telescopic cascode structures may be implemented with NMOS transistors in signal path and thus speed of gain amplifier 180 may also be enhanced (since NMOS transistors provide more bandwidth than PMOS transistors).

It may be further noted that during sampling phase, main-amplifier 420 holds the previous sampled value and does not resolve bits. The output of main-amp 420 may settle by the falling edge of H-phase signal at time point 531 of FIG. 5 and comparators present in flash ADC of next stage can sample the output immediately.

However, comparator bit decisions may not be needed immediately and can be provided after half of a clock signal at the falling edge of S-phase signal at time point 513 of FIG. 5 since comparator decisions are needed only during H-phase of clock signal.

Thus, comparators present in flash ADC of next stage can use the output on path 412 and make bit decisions in the entire half cycle of clock signal during sampling phase. As a result, the design complexity of comparators may be reduced, which may reduce power consumption and area requirements. The reduced area may further reduce the capacitive load offered to the gain amplifier in the prior stage. Thus, a pipeline ADC may be implemented with high speed gain amplifier and substantially reduced power consumption.

In H-phase, gain amplifier settles to the sampled value by ensuring that the sampling capacitor of the next stage is disconnected from the gain amplifier. As a result, gain amplifier is loaded by only the parasitic capacitance, which can be negligible. In S-phase, main-amplifier is disconnected from the pre-amplifier. The main-amplifier alone charges the next stage sampling capacitor. Since main-amp 420 can be implemented using all NMOS transistors in signal path, main-amp 420 can drive the load (sampling capacitor 430-5 of next stage) much faster than two-stage miller compensated amplifier of FIG. 2A. In addition, since the main-amplifier may be implemented with low gain, and alone charges the capacitive load of the next stage, stability may be achieved.

It may be further appreciated that the zero bit stage provides the amplified residue signal to the next non-zero stage, while the prior non-zero stage samples the next output. Due to such pipelining, zero bit stage may not impede the throughput performance of the overall ADC.

Even though, the circuits of above are described with reference to single ended signals, various aspects of the present invention may also be implemented with differential signals as described below.

6. Gain Amplifier in a Differential Mode

Figure 8:
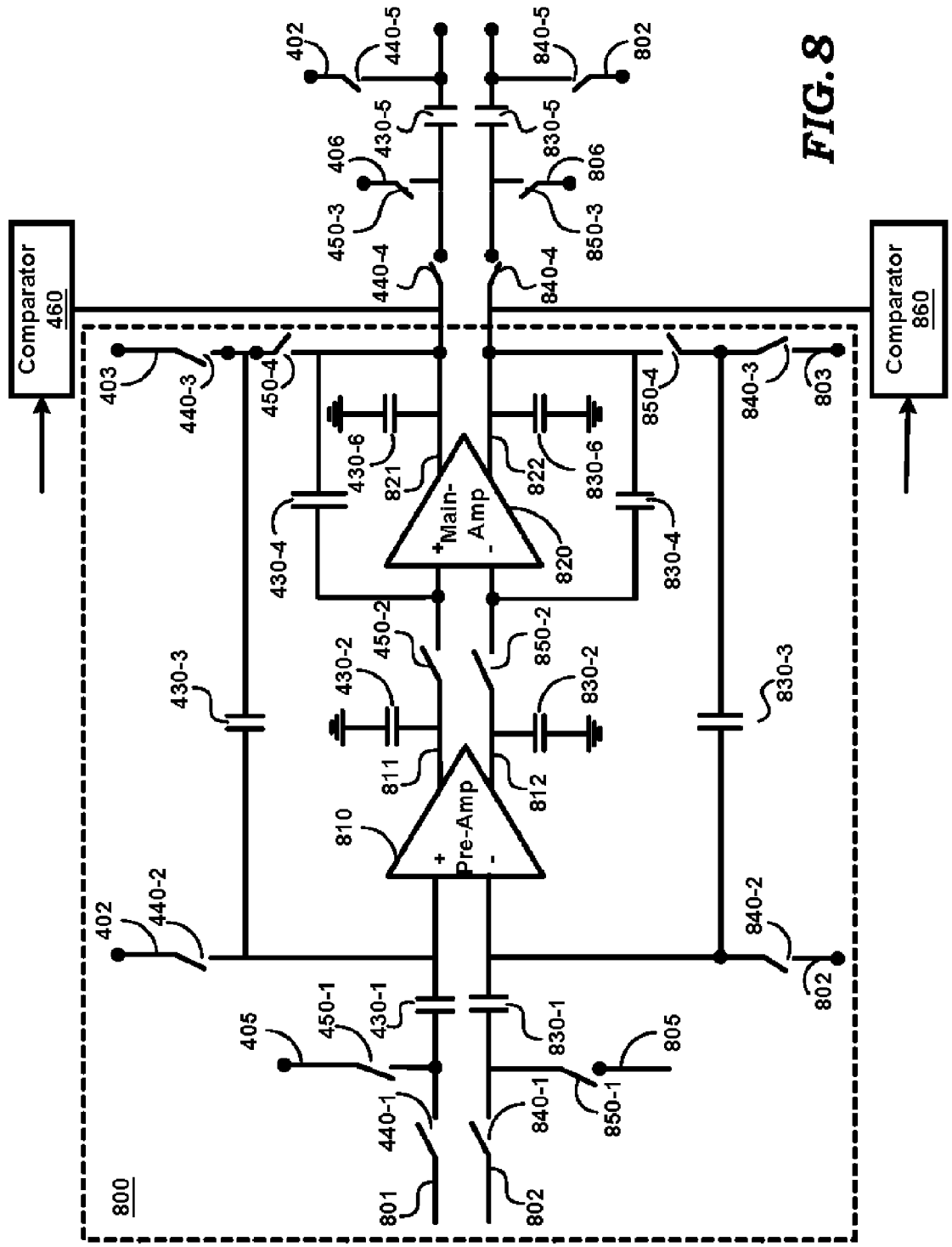
FIG. 8 is a circuit diagram illustrating the configuration of a gain amplifier processing differential signals in an embodiment of the present invention.

FIG. 8 is a circuit diagram illustrating the details of circuit 800 (containing gain amplifier 180 and subtractor 170) implemented with differential signals in an embodiment of the present invention. Circuit 800 is shown containing pre-amp 810, main-amp 820, capacitors 430-1 through 430-4, 430-6, 830-1 through 830-4 and 430-6, and switches 440-1 through 440-3, 450-1, 450-2, 450-4 and 840-1 through 840-3, 850-1, 850-2 and 850-4. FIG. 8 is also shown containing capacitors 430-5 and 830-5, and switches 440-4, 440-5, 450-3, 840-4, 840-5 and 850-3, which may be contained in the gain amplifier of next stage 120-2 of FIG. 1A.

Circuit 800 receives input differential signals inp and inm on respective paths 801 and 802. Pre-amp 810 generates differential signals on paths 811 and 812, which are provided as differential inputs to main-amp 820. Main-amp 820 generates differential output signals on paths 821 and 822.

Capacitors 830-1 through 830-6, and switches 840-1 through 840-5 and 850-1 through 850-4 operate similar to capacitors 430-1 through 430-6, and switches 440-1 through 440-5 and 450-1 through 450-4 as described above with reference to FIG. 4.

During sampling phase, pre-amp 810 and main-amp 820 are disconnected through switches 450-2 and 850-2. Sampling capacitors 430-1 and 830-1 samples respective input signals inp 801 and inm 802. Similarly, capacitors 430-4 and 830-4 provide the input signals on respective paths 821 and 822 to the next stage.

During hold phase, pre-amp 810 and main-amp 820 together amplify and hold the previously sampled signal level. The manner in which pre-amp 810 and main-amp 820 may be implemented is described below.

7. Telescopic Cascode Structure of Gain Amplifier

Figure 9:
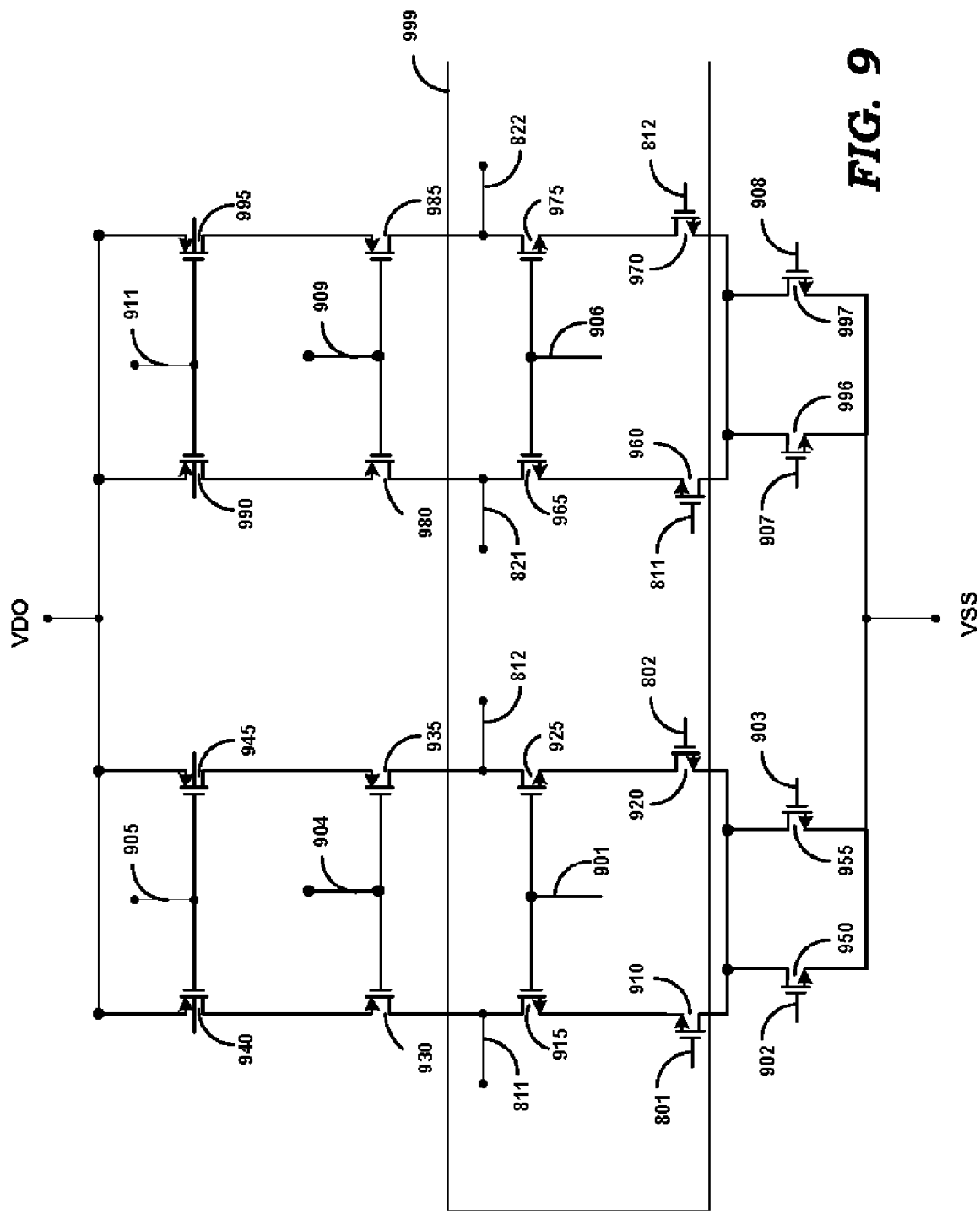
FIG. 9 is a circuit diagram illustrating the details of a pre-amplifier and a main-amplifier used in a gain amplifier.

FIG. 9 is a circuit diagram illustrating the details of pre-amp 810 and main-amp 820 in an embodiment of the present invention. Circuit 800 is shown containing NMOS transistors 910, 915, 920, 925, 950, 955, 960, 965, 970, 975, 996 and 997, and PMOS transistors 930, 935, 940, 945, 980, 985, 990 and 995.

Transistors 910, 915, 920, 925, 930, 935, 940, 945, 950 and 955 together operate as pre-amp 810. Transistors 910 and 920 receive input signals inp 801 and inm 802 on respective gate terminals. Transistors 915 and 925 receive a first cascode voltage on path 901 and transistor 950 receive a first bias voltage on gate terminal 902. Transistor 955 receive common mode voltage for pre-amplifier 810 on path 903. Transistors 930 and 935 receive a second cascode voltage on path 904 and transistors 940 and 945 receive a second bias voltage on path 905.

Similarly, transistors 960, 965, 970, 975, 980, 985, 990, 995, 996 and 997 together operate as main-amp 820. Transistors 960 and 970 receive input signals from pre-amp 810 on respective paths 811 and 812 on corresponding gate terminals and provides the amplified output signals on paths 821 and 822. Transistors 965 and 975 receive a third cascode voltage on path 906 and transistor 996 receive a third bias voltage on gate terminal 907. Transistor 997 receives common mode voltage for main-amplifier 820 on path 908. Transistor 980 and 985 receive a third cascode voltage on path 909 and transistors 990 and 995 receive a third bias voltage on path 911.

It may be noted that block shown as 999 contains all NMOS transistors 910, 915, 920, 925, 960, 965, 970 and 975, which process input signals received on paths 801 and 802. Since NMOS transistors process the input signal, the bandwidth/speed of gain amplifier may be enhanced.

8. Analog Front End

Figure 10:
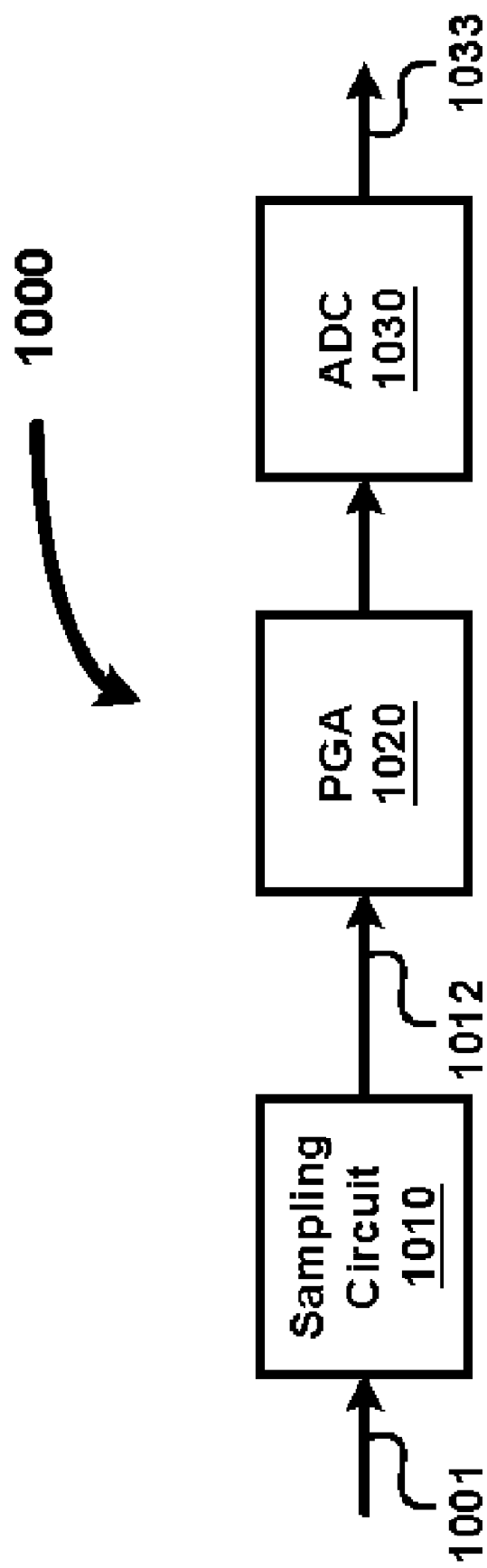
FIG. 10 is a block diagram of an analog front end illustrating the details (in one embodiment) as relevant to an understanding of several aspects of the present invention.

FIG. 10 is a block diagram of an analog front end illustrating the details (in one embodiment) as relevant to an understanding of several aspects of the present invention. AFE 1000 is shown containing sampling circuit 1010, programmable gain amplifier (PGA) 1020 and analog to digital converter (ADC) 1030. Each component is described below in further detail.

Sampling circuit 1010 samples the voltage levels on a source signal received on path 1001 and generates a voltage level corresponding to the sample. Sampling circuit 1010 may further perform operations such as correlated double sampling (CDS) to generate the voltage level. PGA 1020 amplifies the voltage level received on path 1012 by a gain specified typically by a designer. Sampling circuit 1010 and PGA 1020 may be implemented in a known way.

Pipeline ADC 1030 digitizes the amplified voltage signal to generate digital elements on path 1033 for further processing. Pipeline ADC 1030 may contain gain amplifiers implemented in accordance with the present invention as described above with reference to example embodiments. The digital elements generated by pipeline ADC 1030 may accurately reflect source signal as gain amplifiers in pipeline ADC 1030 may be implemented to provide output accurately with a high speed. An example device which uses analog front end 1000 is described below with reference to FIG. 11.

9. Example Device

Figure 11:
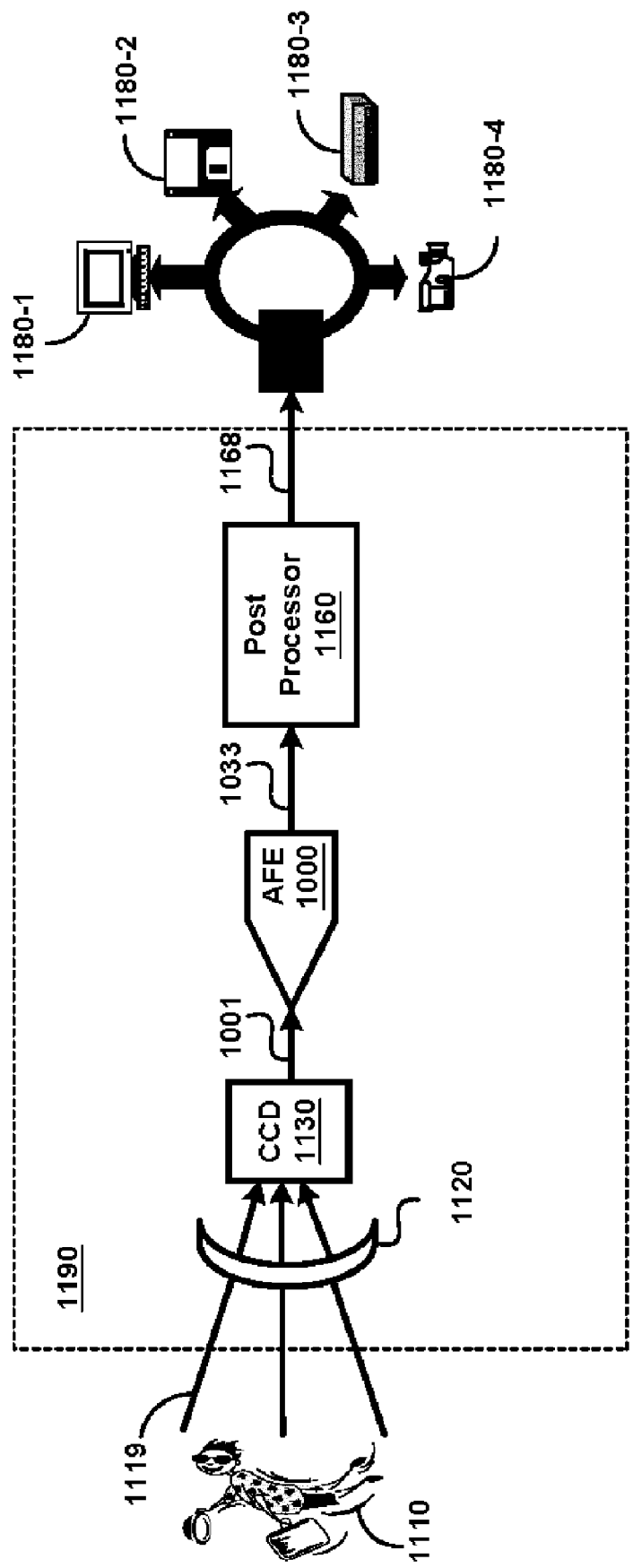
FIG. 11 is a block diagram illustrating an example device in which the present invention can be implemented.

FIG. 11 is a block diagram illustrating an example device in which the present invention can be implemented. Light 1119 emanating from image 1110 is shown being passed to device 1190 (such as a digital camera or a scanner). Device 1190 generates pixel data elements representing image 1110. The pixel data elements may be forwarded on path 1168, and used in several ways, for example, viewed/edited by computer system 1180-1, stored in floppy disk 1180-2, printed on printer 1180-3 or transferred to video player 1180-4.

Device 1190 is shown containing lens 1120, CCD (Charge Coupled Device) 1130, analog front end (AFE) 1000 and post processor 1160. Light 1119 from image 1110 is shown being focused on CCD 1130 by lens 1120. CCD 1130 contains several pixels which are charged proportionate to the product of the intensity of the incident light and the time of exposure to the light. The charge (example of an electrical signal) is converted into voltage in a known way and transferred to AFE 1000 on path 1001.

AFE 1000 converts an input signal received on path 1001 into digital values (on path 1033) representing the image, and transmits the digital values to post processor 1160. AFE 1000 may employ techniques such as correlated double sampling (which are well known in the relevant arts) to generate a voltage level corresponding to each pixel processed by AFE 1000. AFE may then sample the voltages to generate the digital values representing the image. Several aspects of the present invention enable AFE 1000 to be implemented while improving the throughput performance ("speed") as described above.

Post processor 1160 (example of a processor) processes the digital values received on path 1033, generally to enhance the quality of image represented by the digital values and/or to convert the data into suitable format for storing. The resulting output data on path 1168 may be used in several ways by one of the external devices, for example, stored in a memory for processing later.

10. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An ADC converting analog samples to corresponding digital codes, said ADC comprising:

a non-zero bit stage receiving an analog input, and generating a sub-code and an analog output, said analog output equaling ((a signal level of said analog input–an equivalent voltage corresponding to said sub-code) *factor), wherein '–' and '*' respectively represent a subtraction operation and a multiplication operation, and factor equals $2^P$, wherein P represents the number of bits in said sub-code; and a zero bit stage providing said analog output to a next non-zero bit stage contained in said ADC.

2. The ADC of claim 1, wherein said non-zero bit stage and said zero bit stage together comprise:

a sampling capacitor receiving said analog input in a first phase, said sampling capacitor further receiving signals representing said equivalent voltage, said sampling capacitor generating a difference of said analog input and said equivalent voltage as an output;

a pre-amplifier and a main-amplifier connected by a first switch, said pre-amplifier receiving said output of said sampling capacitor, said first switch being closed in a second phase such that said output of said sampling capacitor is amplified by a combination of said pre-amplifier and said main-amplifier to generate an amplified output; and a capacitor connected across said main-amplifier to be charged to said amplified output, wherein said main-amplifier provides said amplified output as said analog output to said next non-zero bit stage in said second phase, and wherein said main-amplifier operates as said zero bit stage.

3. The ADC of claim 2, wherein said first switch is open in said first phase such that said sampling capacitor can be used to sample said analog input in said first phase.

4. The ADC of claim 3, wherein said first phase and said second phase respectively comprise a sampling phase and a hold phase.

5. The ADC of claim 3, wherein each of said pre-amplifier and said main-amplifier contain NMOS transistors in a signal path processing said analog input.

6. The ADC of claim 4, wherein each of said pre-amplifier and said main-amplifier is implemented as a telescopic cascode structure.

7. The ADC of claim 3, further comprising a sub-ADC for generating said sub-code from said analog input, said sub-ADC comprising a plurality of comparators, each of said plurality of comparators comparing said analog input with a voltage level representing a corresponding value of said sub-code, wherein each of said plurality of comparators is provided a time duration covering said first phase to provide a result of corresponding comparison.

8. The ADC of claim 3, wherein said non-zero bit stage and said zero bit stage are implemented using differential signals.

9. The ADC of claim 3, further comprising a error correction circuit receiving said sub-code and generating a digital code corresponding to said analog input, wherein said non-zero bit stage comprises a first stage in said ADC.

10. A gain amplifier for amplifying an input signal and providing an amplified output on an output path, said gain amplifier comprising:

a pre-amplifier receiving said input signal;

a main-amplifier having an output terminal and an input terminal;

a capacitor being connected between said input terminal and said output terminal; and a first switch provided between said pre-amplifier and said main-amplifier, said first switch being closed in a second phase such that said input signal is amplified by a combination of said pre-amplifier and said main-amplifier to generate an amplified output, said amplified output charging said capacitor, said first switch being in an open state in a first phase such that said main-amplifier alone drives said output path to provide said amplified output, wherein said capacitor is connected between said input terminal and said output terminal in both of said first phase and said second phase such that the effective capacitance provided between said input terminal and said output terminal remains the same in both said first phase and said second phase.

11. An integrated circuit used in an analog to digital converter (ADC), said integrated circuit comprising:

a sub-ADC generating a sub-code from an analog input;

a sampling capacitor receiving said analog input in a first phase, said sampling capacitor further receiving signals representing an equivalent voltage corresponding to said sub-code in a second phase, said sampling capacitor generating a difference of said analog input and said equivalent voltage as a residue output;

a pre-amplifier receiving said residue output;

a main-amplifier having an output terminal and an input terminal;

a capacitor being connected between said input terminal and said output terminal; and a first switch provided between said pre-amplifier and said main-amplifier, said first switch being closed in said second phase such that said residue output is amplified by a combination of said pre-amplifier and said main-amplifier to generate an amplified output, said amplified output charging said capacitor, said first switch being in an open state in a first phase such that said main-amplifier alone drives said output path to provide said amplified output, wherein said capacitor is connected between said input terminal and said output terminal in both of said first phase and said second phase such that the effective capacitance provided between said input terminal and said output terminal remains same in both of said first phase and said second phase.

12. The integrated circuit of claim 11, wherein each of said pre-amplifier and said main-amplifier contains a plurality of NMOS transistors in a signal path processing said analog input.

13. The integrated circuit of claim 12, wherein each of said pre-amplifier and said main-amplifier is implemented as a telescopic cascode structure.

14. The integrated circuit of claim 13, wherein said sub-ADC comprises a plurality of comparators, each of said plurality of comparators comparing said analog input with an equivalent voltage representing a corresponding value of said sub-code, wherein each of said plurality of comparators is provided a time duration covering said first phase to provide a result of corresponding comparison.

15. The integrated circuit of claim 14, wherein said pre-amplifier and main-amplifier are implemented using differential signals.

16. The integrated circuit of claim 15, further comprising an error correction circuit receiving said sub-code and generating a digital code corresponding to said analog input.

17. A device comprising:
an analog to digital converter (ADC) converting analog samples to corresponding digital codes, said ADC comprising:
a sub-ADC generating a sub-code from an analog input, wherein said analog input comprised in said analog samples;
a sampling capacitor receiving said analog input in a first phase, said sampling capacitor further receiving signals representing an equivalent voltage corresponding to said sub-code in a second phase, said sampling capacitor generating a difference of said analog input and said equivalent voltage as a residue output;
a pre-amplifier receiving said residue output;
a main-amplifier having an output terminal and an input terminal;
a capacitor being connected between said input terminal and said output terminal; and
a first switch provided between said pre-amplifier and said main-amplifier, said first switch being closed in said second phase such that said residue output is amplified by a combination of said pre-amplifier and said main-amplifier to generate an amplified output, said amplified output charging said capacitor,
said first switch being in an open state in a first phase such that said main-amplifier alone drives said output path to provide said amplified output,
wherein said capacitor is connected between said input terminal and said output terminal in both of said first phase and said second phase such that the effective capacitance provided between said input terminal and said output terminal remains same in both of said first phase and said second phase.

18. The device of claim 17, wherein each of said pre-amplifier and said main-amplifier comprises a plurality of NMOS transistors in a signal path processing said analog input.

19. The device of claim 18, wherein each of said pre-amplifier and said main-amplifier is implemented as a telescopic cascode structure.

20. The device of claim 19, wherein said sub-ADC comprises a plurality of comparators, each of said plurality of comparators comparing said analog input with an equivalent voltage representing a corresponding value of said sub-code, wherein each of said plurality of comparators is provided a time duration covering said first phase to provide a result of corresponding comparison.

21. The device of claim 20, wherein said pre-amplifier and main-amplifier are implemented using differential signals.

22. The device of claim 21, further comprising an error correction circuit receiving said sub-code and generating a digital code corresponding to said analog input.

23. The device of claim 22, wherein said device captures an image in a digital form, said device comprises:
an image sensor allowing a light corresponding to said image to be incident on said image sensor, wherein said image sensor generating an electrical signal proportionate to the intensity of incident light; and
an analog front end (AFE) processing said electrical signal, said AFE comprising said analog to digital converter, said analog input being generated based on said electrical signal.

24. The device of claim 23, wherein said image sensor contains a plurality of pixels, wherein each of said plurality of pixels stores a charge proportionate to the intensity of incident light and said image sensor generating an input signal proportionate to said charge.

25. The device of claim 24, wherein said AFE further comprises:
a sampling circuit sampling said input signal to generate a sampled output; and
a programmable gain amplifier (PGA) amplifying said sampled output to generate said analog input representing said image.

26. The device of claim 25, said device further comprises:
a processor processing said digital codes; and
a memory storing said digital codes.

27. The device of claim 26, wherein said image sensor comprises a charge coupled device (CCD).

* * * * *